(12) United States Patent
Hawk

(10) Patent No.: US 8,736,076 B2
(45) Date of Patent: May 27, 2014

(54) MULTI-CHIP STACKING OF INTEGRATED CIRCUIT DEVICES USING PARTIAL DEVICE OVERLAP

(75) Inventor: Donald E. Hawk, King of Prussia, PA (US)

(73) Assignee: LSI Corporation, Milpitas, CA (US)

( * ) Notice: Subject to any disclaimer, the term of this patent is extended or adjusted under 35 U.S.C. 154(b) by 18 days.

(21) Appl. No.: 13/572,135

(22) Filed: Aug. 10, 2012

(65) Prior Publication Data

US 2014/0042601 A1 Feb. 13, 2014

(51) Int. Cl.
*H01L 23/12* (2006.01)
*H01L 21/00* (2006.01)

(52) U.S. Cl.
USPC ............ 257/777; 257/E25.006; 257/E25.021; 257/E25.027; 257/E23.085; 438/106; 438/110

(58) Field of Classification Search
USPC .................. 257/723, 777, 686, 685, E25.006, 257/E25.013, E25.021, E25.027, E23.085, 257/E23.052, E21.503; 438/109, FOR. 368, 438/FOR. 426, 106, 110
See application file for complete search history.

(56) References Cited

U.S. PATENT DOCUMENTS

| | | | |
|---|---|---|---|
| 6,127,736 A | 10/2000 | Akram | |
| 7,838,975 B2 | 11/2010 | Chen | |
| 8,093,722 B2 | 1/2012 | Chen et al. | |
| 8,105,915 B2 * | 1/2012 | Camacho et al. | 438/455 |
| 8,188,581 B2 | 5/2012 | Shi et al. | |
| 8,435,835 B2 * | 5/2013 | Pagaila et al. | 438/107 |
| 2011/0233789 A1 | 9/2011 | Drost et al. | |

OTHER PUBLICATIONS

"Design and Reliability nin Wafer Level Packaging", Huejun Fan and Qiang Han, pp. 834-841, 2008.*

* cited by examiner

*Primary Examiner* — Jasmine Clark

(57) ABSTRACT

One aspect provides an integrated circuit (IC) packaging assembly that comprises a substrate having conductive traces located thereon, wherein the signal traces are located in an IC device region and the power traces are located in a wafer level fan out (WLFO) region located lateral the IC device region. This embodiment further comprises a first IC device located on a first side of the substrate within the IC device region and that contacts the signal traces in the IC device region. A second IC device is located on a second side of the substrate opposite the first side and overlaps the IC device region and the WLFO region. The second IC device contacts a first portion of the signal traces in the IC device region and contacts a first portion of the power traces in the WLFO region.

20 Claims, 6 Drawing Sheets

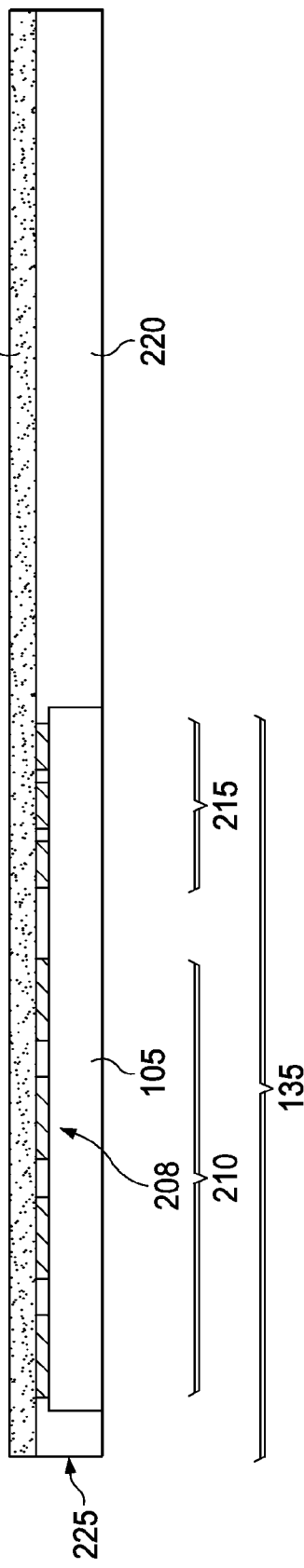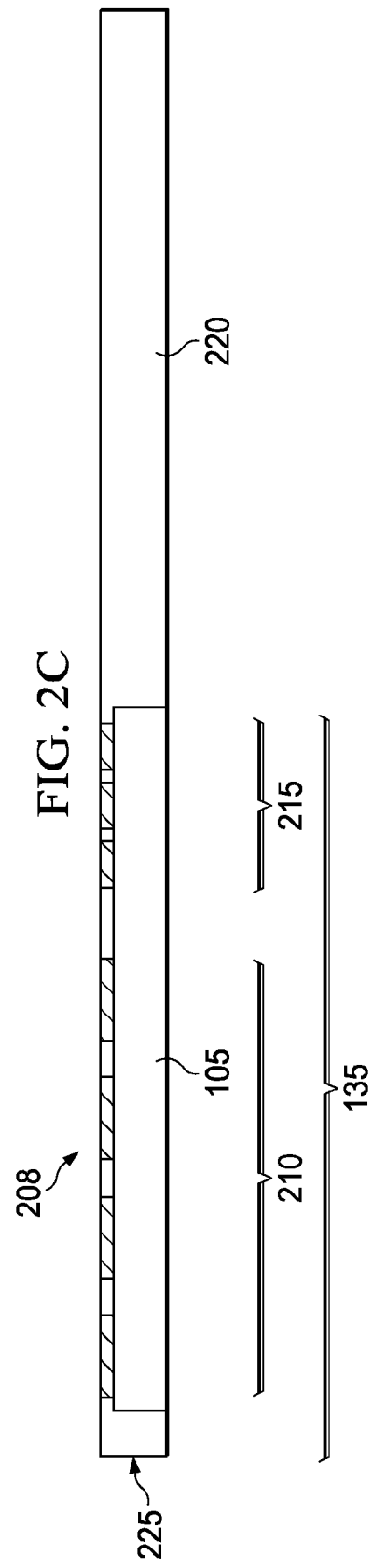

MULTI-CHIP STACKING OF INTEGRATED CIRCUIT DEVICES USING PARTIAL DEVICE OVERLAP

TECHNICAL FIELD

This application is directed to a multi-chip stacking of integrated devices using partial device overlap.

BACKGROUND

The adoption of three-dimensional stacking of Integrated circuit (IC) devices package assemblies has gained use in present day technologies, such as those that are used in wireless communication devices and memories. One integration technology that has helped manufacturers achieve this successful utilization is the through silicon via, more commonly known by the acronym, TSV used in combination with direct chip attach via micro-bumps or copper pillar technology. TSV is an important developing technology that utilizes short, vertical electrical connections or "vias" that pass directly through a silicon wafer in order to establish an electrical connection from the active side to the backside of the die, thus providing the shortest interconnect path and creating an avenue for the ultimate in 3D integration. Direct chip attach technologies, such as copper pillars, offer greater space efficiencies and higher interconnect densities than wire bonding and flip chip technology. The combination of these technologies enables a higher level of functional integration and performance in a smaller form factor in that their presence allows a manufacturer to stack vertically IC devices and pass electrical signals and power and ground up and down the through the stack.

SUMMARY

One aspect provides an integrated circuit (IC) packaging assembly that comprises a substrate having conductive signal and power traces located thereon. Signal traces are located in an IC device region and power traces are located in a wafer level fan out (WLFO) region located lateral the IC device region. This embodiment further comprises a first IC device located on a first side of the substrate within the IC device region and that contacts the signal traces in the IC device region. A second IC device is located on a second side of the substrate opposite the first side and overlaps the IC device region and the WLFO region. The second IC device contacts a first portion of the signal traces in the IC device region and contacts a first portion of the power traces in the WLFO region.

Another embodiment is directed to an integrated circuit (IC) multi-chip packaging assembly, comprising first and second sub-packaging assemblies. The first sub-packaging assembly comprises a substrate having conductive signal and power traces located thereon. Signal traces are located in an IC device region and power traces are located in a wafer level fan out (WLFO) region located lateral the IC device region. This embodiment further comprises a first IC device located on a first side of the substrate within the IC device region and that contacts the signal traces in the IC device region. A second IC device is located on a second side of the substrate opposite the first side and overlaps the IC device region and the WLFO region. The second IC device contacts a first portion of the signal traces in the IC device region and contacts a first portion of the power traces in the WLFO region. The second sub-packaging assembly comprises a second substrate having interconnects and a recess, wherein the second IC device is received within the recess. The first sub-packaging assembly is electrically connected to the interconnects of the second sub-packaging assembly by a third portion of the signal traces in the IC device region and by a second portion of the power traces in the WLFO region.

Yet another embodiment provides a method of manufacturing an integrated circuit (IC) multi-chip packaging assembly. In this embodiment, the method comprises forming conductive signal traces and power traces on a substrate, wherein signal traces are located in an IC device region, and power traces are located in a wafer level fan out (WLFO) region located laterally the IC device region. The method further comprises attaching a first IC device on a first side of the substrate within the IC device region and contacting the signal traces in the IC device region, and attaching a second IC device on a second side of the substrate opposite to the first side and overlapping the IC device region and the WLFO region. The second IC device contacts a first portion of the signal traces in the IC device region and contacts a first portion of the power traces in the WLFO region.

BRIEF DESCRIPTION

Reference is now made to the following descriptions taken in conjunction with the accompanying drawings, in which:

FIGS. 2A-2D illustrates one embodiment of method of fabricating the IC packaging assembly of FIG. 1;

DETAILED DESCRIPTION

The present disclosure is directed to a packaging assembly that utilizes wafer-level-fan-out (WLFO) and direct face-to-face chip attachment that eliminates the need for through silicon via (TSV) to achieve similar levels of integration. This is a significant manufacturing advantage because TSV introduces additional silicon processing steps and cost adders. Additionally these silicon structures can introduce signal delay beyond which is tolerable for certain applications. The use of TSV also has implications on layout configurations of both die and requires sharing of power ground resources among multiple devices. The present disclosure eliminates the need for TSV technology in the substrate to which the IC devices are attached to achieve similar levels of integration and allows devices to obtain power from separate power grids.

The various embodiments of this disclosure utilize the above-mentioned WLFO technology. WLFO embeds an IC device within a molded substrate, such as an epoxy mold compound (EMC), that extends the boundary of a conventional IC device. Once this extended WLFO region is formed, additional levels of conductive traces are patterned over the die and the EMC region, using silicon or flat panel display technology. This permits a high density of signals and power and ground contact points on the die to be redistributed to larger interconnect pitches, which can be assembled to a conventional IC package by means, such as flip chip bumping processes.

The partial overlap of the devices present in the embodiments discussed herein provides the advantage of exposing a portion of one or more devices to a standard package-like configuration and allows for the use of conventional package interconnects. Additionally, it allows both devices to be independently powered without the need for shared power grid resources and allows current high speed interconnects to the package, which are well characterized. The embodiments covered by this disclosure also move the die-to-die connections to an edge placement so as not to interfere with standard core floor plan arrangements. The on edge placement also allows for more of the IC device to be exposed, thereby providing greater surface area for more direct connectivity. These die-to-die interconnects can be done without long redistribution routes, thereby reducing delay concerns. The present disclosure may be used in baseband (DSP), applications, processors, power management, RF transceiver, or memory for wireless mobile or digital consumer product applications, where the I/O counts are higher, for example up around 750.

Figure 1:
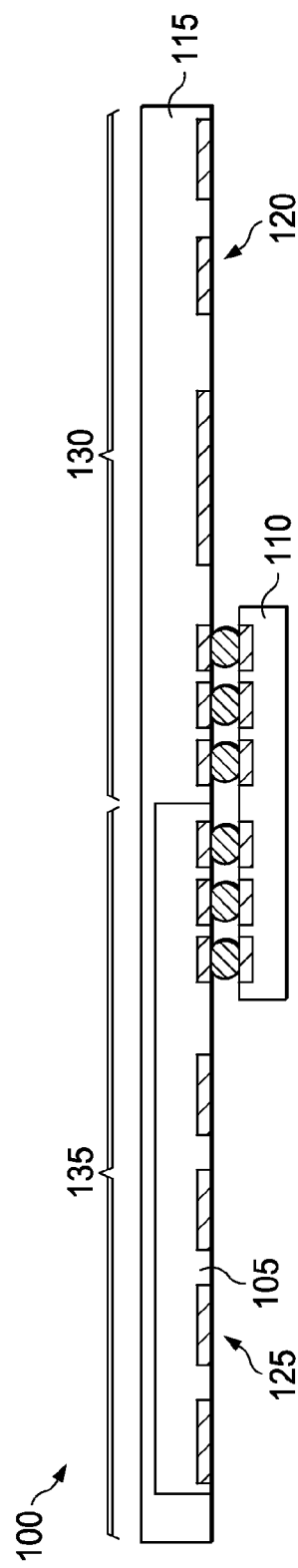
FIG. 1 illustrates an embodiment of a IC packaging assembly.

FIG. 1 illustrates one embodiment of an IC packaging sub-assembly 100, as provided by this disclosure. It is comprised of at least two IC devices 105 and 110. Other embodiments provide a configuration that includes more than two of the IC devices 110. Neither IC device 105 nor 110 need employ TSVs as means of interconnect, however, in certain embodiments, they may be present in one or both of the IC devices 105, 110. As used herein and in the claims, a TSV is a vertical electrical connection or "via" passing from the active device side of silicon wafer to the backside of said silicon wafer. The IC devices 105 and 110 are attached on opposing sides (e.g., line of division) of a substrate 115 that has conductive power and signal traces 120, 125, such as interconnect metal lines or runners, located thereon that can transmit current or data signals, depending on the designed configuration. As explained below, the substrate 115 may be a reconstituted wafer or other substrate that can be used in forming a WLFO IC package.

In certain advantageous embodiments, the substrate 115 to which the IC device 105, 110 are attached, is free of a TSV, which provides the advantages of reducing cost adders and the possibility of signal degradation. As used herein and in the claims "free of a TSV" means that the substrate 115 itself to which IC devices 105, 110 are attached does not include a TSV structure, though as mentioned above, this does aspect does not preclude the devices 105, 110 from having a TSV. In the illustrated embodiment, the power traces 120 are located in a WLFO region 130 of substrate 115, and the signal traces 125 are located in an IC device region 135 of substrate 115. The WLFO region 130 is located laterally to either or both sides of the IC device region 135. However, it should be understood that the location of power traces 120 and signal traces 125 is not confined to the regions just mentioned above. For example, in some embodiments, a portion of the signal traces 125 may be located in the WLFO region 130 and a portion of the power traces 120 may be located in the IC device region 135 when required by design parameters. Moreover, the power and signal traces 120, 125 may be present above the IC device 100 in region 135 and similarly below device 110 in WLFO region 120. This provides a means by which both devices 105, 110 can make second-level interconnections to a conventional package substrate through connections to exposed traces 120 and 125.

As used herein and in the claims, the WLFO region 130 is that part of the substrate 115 that lies outside the perimeter of the IC device region 135. The WLFO region 130 provides enough space around the IC device region 135 to accommodate second-level connections, such as power or signal connections, for additional IC devices, such as processors or memory chips. In the illustrated embodiment of FIG. 1, the WLFO region 130 has a design layout that provides power to an IC device that is connected to the substrate 115 within the WLFO region 130, when the IC packaging assembly 100 is connected to an electrical power source. This allows the attached device to obtain power from a separate power grid from that of the IC device located within the IC device region 135.

WLFO technology uses a combination of front-end and back-end manufacturing techniques with parallel processing of all the chips on a wafer, which can greatly reduce manufacturing costs. Its benefits include a smaller package footprint compared to conventional lead frame or laminate packages, medium to high I/O count, maximum connection density, as well as desirable electrical and thermal performance. It also offers a high-performance, power-efficient solution for the wireless market.

The IC device 105 is located on a first side (i.e., a line of division) of the substrate 115 and within the IC device region 135 that contacts signal traces 125 located in the IC device region 135. The IC device 105 may be any type of electro-silicon device, including IC analog or digital devices, such as an application-specific integrated circuit (ASIC) or generic processors, etc.

The second IC device 110 is located on a second side of the substrate 115, opposite the first side. The active side of the IC device 105 faces the active side of the IC device 110, which overlaps the WLFO region 130 and the IC device region 135. This configuration eliminates the need for TSVs and overlaps the WLFO region 130 and the IC device region 135. The second device 110 may be the same type of device as the IC device 105 and may also include IC devices, such as memory chips or processors, etc. In certain embodiments, the second IC device 110 may itself be an assembly of multiple IC devices, such as a memory cube. The second IC device 110 contacts a portion of the signal traces 125 in the IC device region 135 and contacts a portion of the power traces 120 in the WLFO region 130, thereby allowing for connectivity to other packaging assemblies or additional devices within the WLFO region 130.

The overlapping configuration of this embodiment allows the second IC device 110 to get power from the WLFO region 130 and exposes more area of the IC device 105 for better direct connectivity. Further, the presence of the power traces 120 allows separate power grids (e.g. interconnection layouts) for the IC device 105 and the IC device 110. For example, the IC device 105 may be configured to be connectable to a first power grid located on another packaging assembly, through one or more of the traces 125, while the second IC device 110 is connected to a second power grid located in the WLFO region 130. The region of overlap between devices 105 and 110 is used for high-density signal connections, on the order of thousands, from device to device, such as copper pillar or micro bumping technology.

This unique configuration is counter-intuitive to present practices that vertically stack devices directly over on one another and on the same side of the substrate. In a vertical stack configuration, such as with the use of TSVs, many of these connections may just serve as a pass through to get signals or power ground to the next die in the stack but may not serve any purpose on the die through which they pass, thus wasting area and routing resources on the intermediate die. With partial overlap as presented herein, this is not the case. Signal or power, which are not required between die, may be placed in the non-overlapping region and connected to the package directly.

FIGS. 2A through 2D illustrate a method of manufacturing the IC package 100, as discussed above. It should be understood that the method of fabrication as set forth therein is for illustrative purposes only and that other conventional WLFO fabrication processes may be used to form the IC package 100. Thus, the present disclosure is not limited to just the method discussed herein.

Figure 2A:
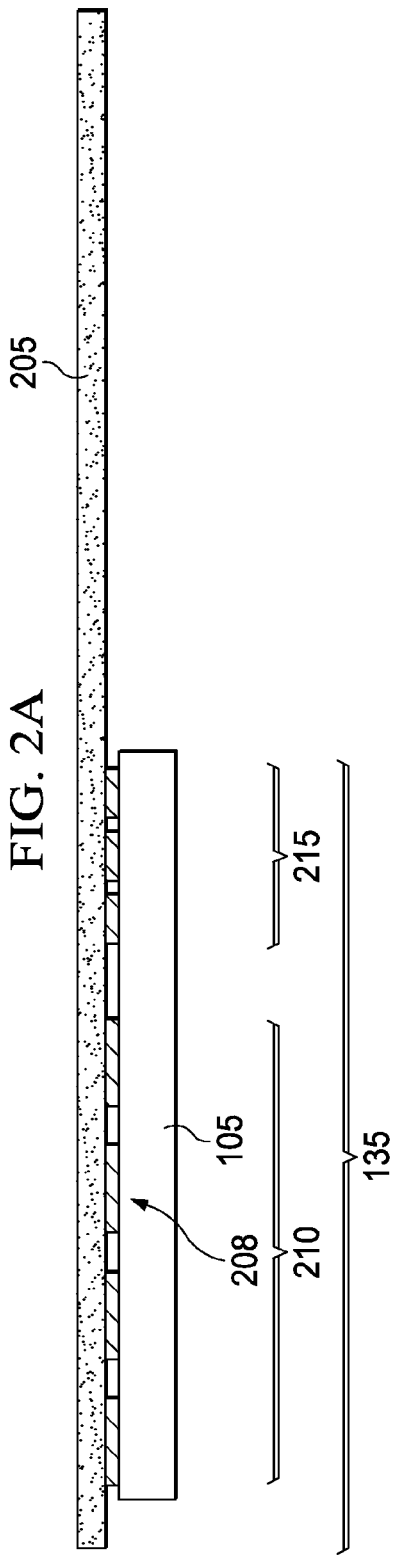

In FIG. 2A, the IC device 105 of FIG. 1 is attached to an adhesive film 205. Only one IC device is shown for illustrative purposes, but it should be understood that a plurality of chips could be attached to the adhesive film 205, if so desired. The IC device 105 may be a conventionally fabricated IC chip that is fabricated on a silicon substrate, wafer sorted into good die, and then singulated into individual chips as seen in FIG. 2A. During fabrication, the IC device 105 is fabricated to provide electrical traces 208 within the IC device region 135 that contact the surface of the IC device 105 to provide electrically connectivity to the IC device 105. In one embodiment, the traces 208 are laid out into separate groups 210 and 215 that have different pitches between two groups, that is the amount of separation between the traces in group 210 is greater than the amount of separation between the traces in group 215. The pitches used in group 210 for example would be suitable for flip chip bump connections to a conventional package substrate whereas the finer pitch in group 215 is suitable for die-to-die interconnect employing copper pillar or micro-bump technology. However, in other embodiments, the traces may all have the same pitch.

After the IC device 105 is attached to the adhesive film 205, a conventional molding material 220, such as an epoxy material, is injected around the IC device 105, which encapsulates or embeds it, within the molding material 220 to form a wafer substrate 225, such as a reconstituted wafer substrates, as seen in FIG. 2B. Once the molding material 220 is set, it is released from the adhesive film 205, thereby exposing the surface of the IC device 105, as seen in FIG. 2C. The resulting device of FIG. 2C can then be treated as a wafer for purposes of fabricating additional layers of dielectric and conductive redistribution layers on the surface of the device.

Figure 2D:
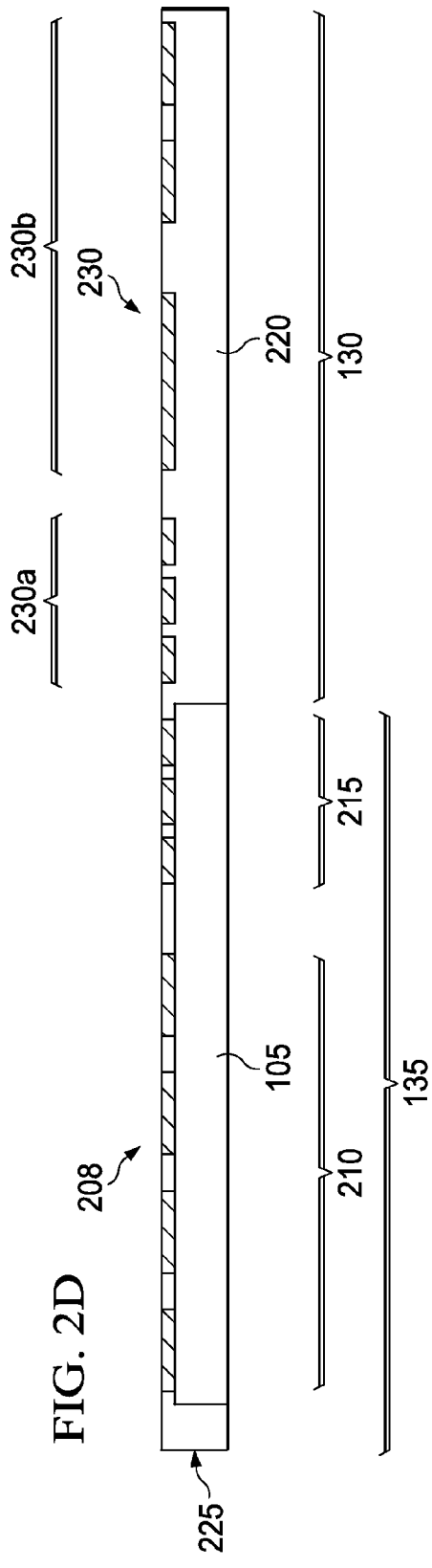

FIG. 2D illustrates traces 230 formed in the molding material 220 and located within the WLFO region 130. As with the traces 208 of the IC device region 135, the traces 230 in the WLFO region 130 may have different pitches in certain embodiments, but in other embodiments, the pitches may be the same. In the illustrated embodiment, the traces 230 are divided into two groups 230a and 230b in which the pitch of the traces 230 in group 230a have a pitch that is less than the traces in group 230b. Moreover, in this particular embodiment, the traces 230 in group 230a have the same pitch as the traces in group 215. This allows for the attachment of a geometrically smaller chip, such as a memory chip that overlaps the IC device region 135 and the WLFO region 130. The closer pitch also provides for sufficient connection points to provide power to the smaller chip from the WLFO region 130 and more signal transmission to the first IC device 105 in the IC device region 135.

Figure 3:
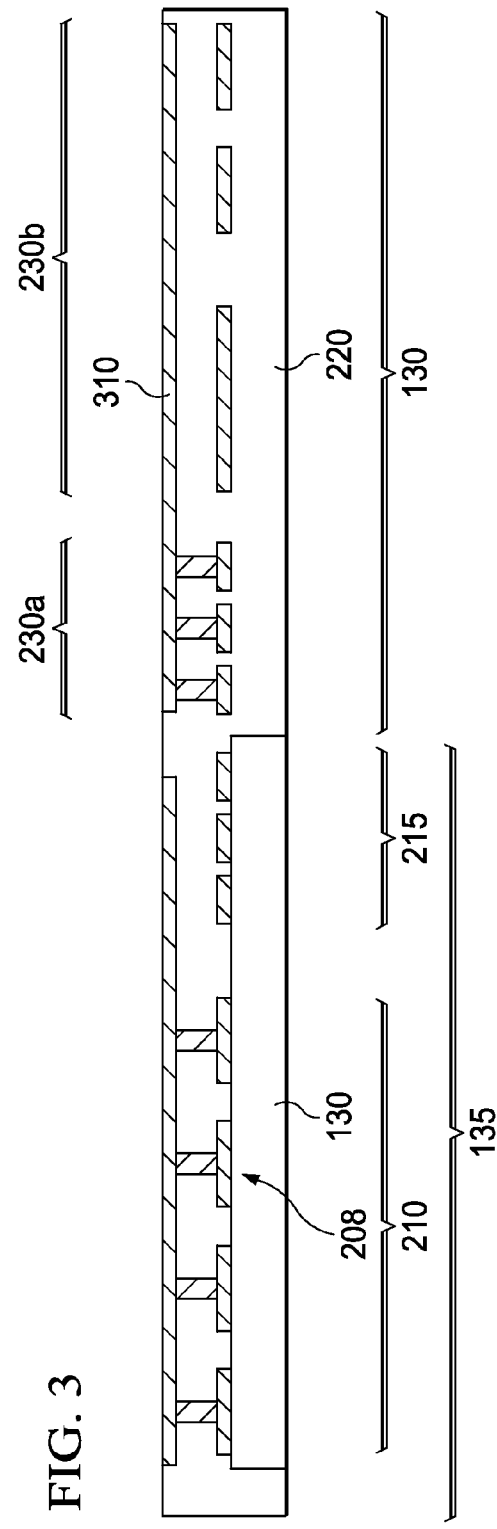
FIG. 3 illustrates another embodiment of the method that includes fabricating interconnects within the substrate.

FIG. 3 merely illustrates how the substrate 225 can include more than one level of interconnects 310. Conventional lithographic and deposition processes may be used to form the interconnects 310. Though, in the illustrated embodiments herein, the above-mentioned traces are located at the surface of the substrate 225 to provide more direct connection between the devices 105, 110 and the substrate 225. The second IC device 110 can then be electrically connected to the sub-assembly of FIG. 3 by way of solder bumps or copper pillars, which results in the IC packaging device 100 of FIG. 1. Once the fabrication of the IC package 100 is complete, it can used as a sub-assembly package that can be then connected to a larger packaging substrate.

Figure 4:
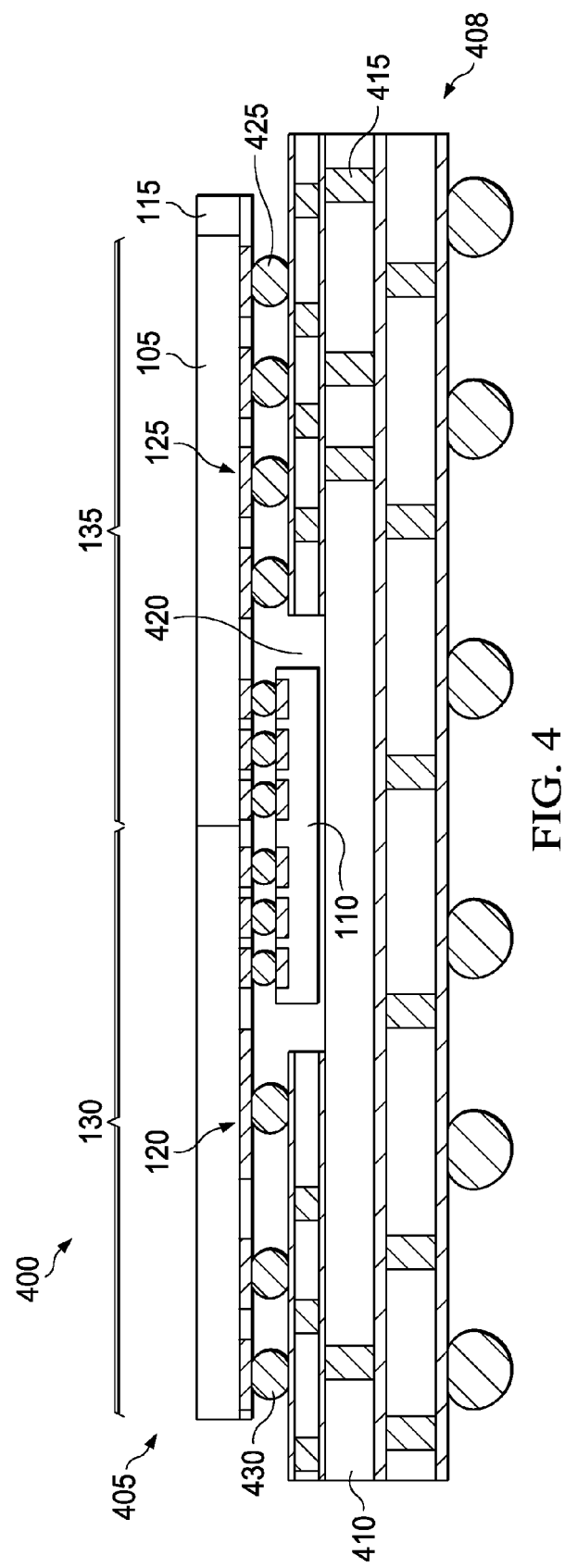
FIG. 4 illustrates another embodiment of an IC packaging assembly having first and second sub-packaging assemblies.

FIG. 4 illustrates such a configuration as just mentioned. FIG. 4 illustrates one embodiment of an integrated circuit (IC) multi-chip packaging assembly 400. This embodiment includes the IC packaging assembly 100 of FIG. 1, which in this embodiment, is a first sub-packaging assembly 405. Since the packaging assembly 100, 400 is discussed above, no further discussion of it will be undertaken here. The assembly 400, however, further includes a second sub-packaging assembly 408 that has a second substrate 410 that includes interconnects 415 and a recess 420 located therein. A purpose of the recess is to overcome thickness restrictions, which might otherwise prevent the complete package assembly process. In this particular embodiment, the second IC device 110 is received within the recess 420. The recess 420 of this embodiment provides for greater vertical compaction in those instances where vertical height is restricted, such as in certain applications of wireless communication devices. Also, the interconnect height for 425, 430 is somewhat proportional to the density of pitches that can be achieved with greater stand-offs requiring larger pitches thus limiting the amount of interconnects to sub-assembly 408. Thus the cavity may permit a higher number of interconnects 425, 430. As seen in this embodiment, the first sub-packaging assembly 405 is connected electrically to the interconnects 415 of the second sub-assembly assembly 400, by a portion of the signal traces 125 and solder bumps 425 in the IC device region 135, and by of a portion of the power traces 120 and solder bumps 430 in the WLFO region 130.

Figure 5A:
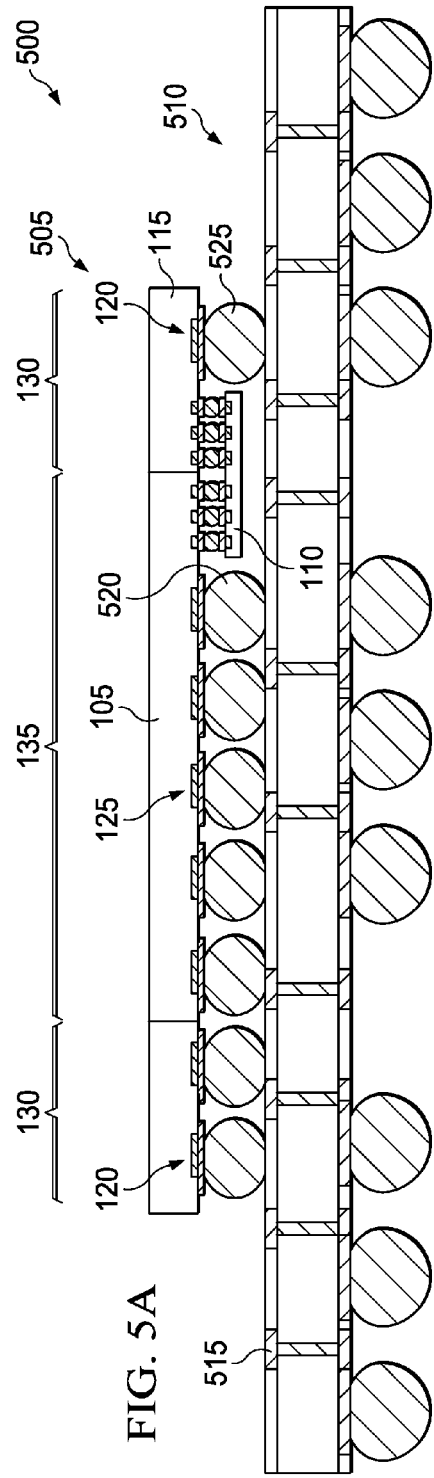
FIG. 5A-5B illustrates another embodiment of the IC packaging assembly where the substrate does not have a recess.

FIG. 5A illustrates another embodiment of an IC multi-chip packaging assembly 500. As with the previous embodiment, assembly 500 also includes the IC packaging assembly 100 of FIG. 1, which in this embodiment, is a first sub-packaging assembly 505. Since the packaging assembly 100, 505 has been discussed above, no further discussion of it will be undertaken here. The assembly 500 further includes a second sub-packaging assembly 510 very similar to the previous embodiment discussed above regarding FIG. 4, but without the recess. In this particular embodiment, the recess located within the substrate is not present. Instead, clearance for the presence of the second IC device 110 is achieved by using larger solder bumps and/or sufficient thinning of IC device 110. This configuration works well in applications were vertical height is not as much of an issue as in other applications and the introduction of a cavity in 510 may be seen as a cost adder. As seen in this embodiment, the first sub-packaging assembly 505 is connected electrically to the interconnects 515 of the second sub-packaging assembly 510 by a portion of the signal traces 125, using solder bumps 520 in the IC device region 135, and by a portion of the power traces 120 using solder bumps 525 in the WLFO region 130.

Figure 5B:
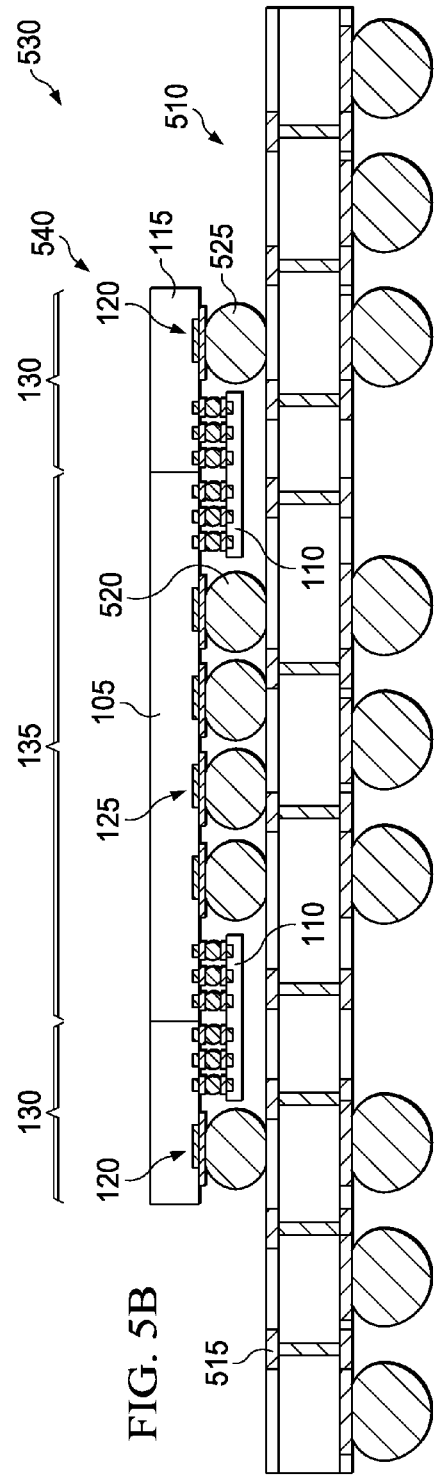

FIG. 5B illustrates another embodiment of an IC multi-chip packaging assembly 530 that includes a sub-packaging assembly 540 that is similar to the IC assembly 100 of FIG. 1. An exception to this is that the sub-packaging assembly 540 includes at least a third IC device 535 that is located on the second side of the substrate 115 that also overlaps the IC device region 135 and WLFO region 130. The IC device 535 contacts a different portion of signal traces 125 in the IC device region 135 and a different portion of the power traces 120 in the WLFO region 130 from that of the second IC device 110, so that each makes connection using different traces. The assembly 530 further includes the second sub-packaging assembly 510 as discussed above regarding FIG. 5A. As seen in this embodiment, the first sub-packaging assembly 540 is more directly connected electrically to the interconnects 515 of the second sub-packaging assembly 510. A portion of the signal traces 125 makes the connection, using solder bumps 520 in the IC device region 135, and by a portion of the power traces 120, using solder bumps 525 in the WLFO region 130. This configuration provides the advantage of offering further processing or memory capabilities by providing for additional IC devices, without requiring additional vertical height.

Figure 6:
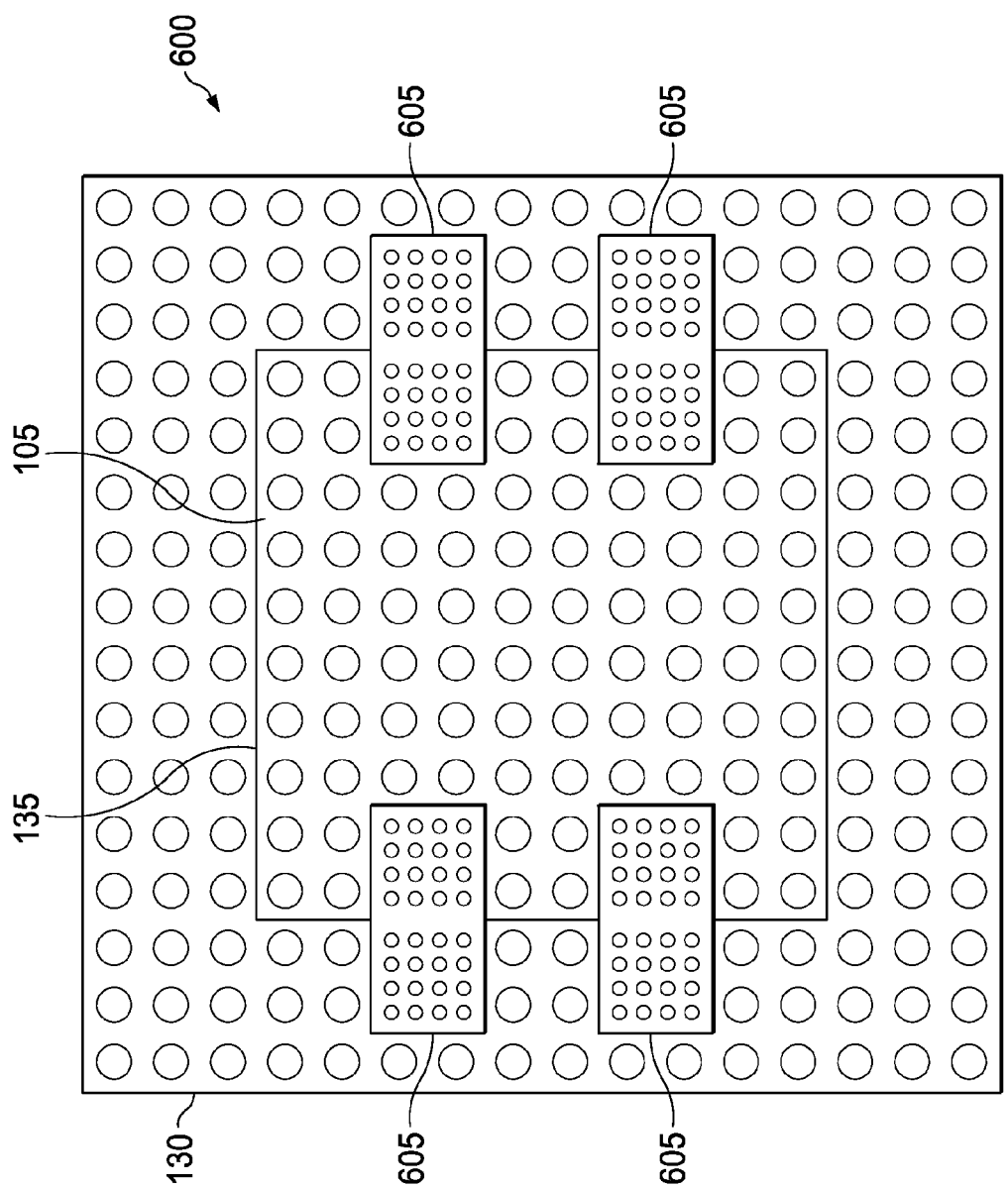
FIG. 6 illustrates an embodiment as provided herein that includes multiple IC devices overlapping and connected to the first IC device in a IC packaging assembly.

FIG. 6 illustrates an overhead view of yet another embodiment of an IC packaging assembly 600. This assembly is similar to that discussed above regarding FIG. 5B with the exception that this embodiment includes additional IC devices 605 that overlap both the IC device region 135 and the WLFO region 130. Thus, as seen from this embodiment, the capabilities of the IC packaging assembly 600 can be further expanded if so desired.

Those skilled in the art to which this application relates will appreciate that other and further additions, deletions, substitutions and modifications may be made to the described embodiments.

What is claimed is:

1. An integrated circuit (IC) multi-chip packaging assembly, comprising:
a substrate having conductive signal and power traces located thereon, wherein said signal traces are located in an IC device region and said power traces are located in a wafer level fan out (WLFO) region located lateral said IC device region;
a first IC device located on a first side of said substrate within said IC device region and contacting said signal traces in said IC device region; and
a second IC device located on a second side of said substrate opposite said first side and overlapping said IC device region and said WLFO region, said second IC device contacting a first portion of said signal traces in said IC device region and contacting a first portion of said power traces in said WLFO region.

2. The IC multi-chip packaging assembly of claim 1, wherein a portion of said signal traces is located in said WLFO region and a portion of said power traces are located in said WLFO region.

3. The IC multi-chip packaging assembly of claim 1, wherein a portion of said signal traces and said power traces have a pitch that is less than a pitch of a remainder of said at least a portion signal traces and said power traces.

4. The IC multi-chip packaging assembly of claim 1, wherein a surface of said signal traces and said power traces is located at an outer surface of said substrate to allow direct connection therewith.

5. The IC multi-chip packaging assembly of claim 1, wherein said first IC device is connected to a first power grid and said second IC device is connected to a second power grid located in said WLFO region.

6. The IC multi-chip packaging assembly of claim 1, wherein said substrate is free of through silicon vias (TSV).

7. The IC multi-chip packaging assembly of claim 1, further comprising at least a third IC device located on said second side and that overlaps said IC device and WLFO regions, and contacts a second portion of said signal traces in said IC device region and a second portion of said power traces in said WLFO region.

8. An integrated circuit (IC) multi-chip packaging assembly, comprising:
a first sub-packaging assembly, comprising:
a substrate having conductive signal and power traces located thereon, wherein said signal traces are located in an IC device region and said power traces are located in a wafer level fan out (WLFO) region located lateral said IC device region;
a first IC device located on a first side of said substrate within said IC device region and contacting a first portion of said signal traces in said IC device region; and
a second IC device located on a second side of said substrate opposite said first side and overlapping said IC device region and said WLFO region, said second IC device contacting a second portion of said signal traces in said IC device region and contacting a first portion of said power traces in said WLFO region; and
a second sub-packaging assembly, comprising:
a second substrate having interconnects and a recess, wherein said second IC device is received within said recess, and said first sub-packaging assembly is electrically connected to said interconnects of said second sub-packaging assembly by a third portion of said signal traces in said IC device region and by a second portion of said power traces in said WLFO region.

9. The IC multi-chip packaging assembly of claim 8, wherein said first substrate comprises a molding material that encapsulates said first IC device and said second substrate comprises two or more interconnect level layers.

10. The IC multi-chip packaging assembly of claim 8, wherein a portion of said signal traces and said power traces have a pitch that is less than a pitch of a remainder of said signal traces and said power traces.

11. The IC multi-chip packaging assembly of claim 8, wherein a surface of said signal traces and said power traces is located at an outer surface of said substrate to allow direct connection therewith.

12. The IC multi-chip packaging assembly of claim 8, wherein said first IC device is connected to a first power grid and said second IC device is connected to a second power grid located in said WLFO region.

13. The IC multi-chip packaging assembly of claim 8, wherein said substrate of said first sub-packaging assembly is free of through silicon vias (TSV).

14. The IC multi-chip packaging assembly of claim 8, further comprising at least a third IC device located on said second side of said substrate and that overlaps said IC device and WLFO regions, wherein said third IC device contacts a fourth portion of said signal traces in said IC device region and a third portion of said power traces in said WLFO region.

15. A method of manufacturing an integrated circuit (IC) multi-chip packaging assembly, comprising:
forming conductive signal traces and power traces on a substrate, wherein signal traces are located in an IC device region, and power traces are located in a wafer level fan out (WLFO) region located laterally said IC device region;
attaching a first IC device on a first side of said substrate within said IC device region and contacting said signal traces in said IC device region; and
attaching a second IC device on a second side of said substrate opposite to said first side and overlapping said IC device region and said WLFO region, said second IC device contacting a first portion of said signal traces in said IC device region and contacting a first portion of said power traces in said WLFO region.

16. The method of claim 15, further including encapsulating said first IC device in a molding material.

17. The method of claim 15, wherein forming said signal and power traces includes forming a portion of said signal traces and said power traces to have a pitch that is less than a pitch of a remainder of said signal traces and said power traces.

18. The method of claim 17, wherein a surface of said signal traces and said power traces is located at an outer surface of said substrate to allow direct connection therewith.

19. The method of claim 15, further comprising attaching at least a third IC device on said second side of said substrate and that overlaps said IC device and WLFO power regions and contacts a second portion of said signal and power traces in said IC device and WLFO regions, respectively.

20. The method of claim 15, wherein said substrate is free of through silicon vias (TSV).

\* \* \* \* \*